US009276335B2

(12) United States Patent
Fricker

(10) Patent No.: US 9,276,335 B2
(45) Date of Patent: Mar. 1, 2016

(54) DOUBLE-SIDED CIRCUIT BOARD WITH OPPOSING MODULAR CARD CONNECTOR ASSEMBLIES

(71) Applicant: Jean-Philippe Fricker, Mountain View, CA (US)

(72) Inventor: Jean-Philippe Fricker, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 391 days.

(21) Appl. No.: 13/710,916

(22) Filed: Dec. 11, 2012

(65) Prior Publication Data

US 2014/0162470 A1 Jun. 12, 2014

(51) Int. Cl.
*H05K 7/00* (2006.01)
*H01R 12/52* (2011.01)
*H01R 12/72* (2011.01)

(52) U.S. Cl.
CPC ............ *H01R 12/523* (2013.01); *H01R 12/724* (2013.01); *H01R 12/721* (2013.01)

(58) Field of Classification Search
USPC ..................................... 361/760, 796; 439/65
See application file for complete search history.

(56) References Cited

U.S. PATENT DOCUMENTS 5,387,861 A * 2/1995 Neiderhofer ............. 324/750.05
6,377,470 B1 * 4/2002 Hayward et al. .............. 361/796
2003/0012004 A1 1/2003 Uehara
2008/0044127 A1 2/2008 Leising et al.
2010/0227508 A1 9/2010 Zhu
2014/0115281 A1 * 4/2014 Coteus et al. ................. 711/154

FOREIGN PATENT DOCUMENTS

JP 05347466 A 12/1993
KR 20100054224 A 5/2010

OTHER PUBLICATIONS

International Search Report and Written Opinion corresponding to PCT/US2013/074147 mailed Mar. 18, 2014, 12 pages.
Wikipedia article, "PC/104", <http://en.wikipedia.org/w/index.php?title=PC/104&oldid=520600295>, Accessed Nov. 8, 2012, 6 pages.
PC/104 Consortium, "Specifications—PC/104", <www.pc104.org/pc104_specs.php>, Accessed Nov. 8, 2012, 2 pages.

* cited by examiner

*Primary Examiner* — Andargie M Aychillhum

(57) ABSTRACT

An electronic assembly includes a circuit board that serves as both a mechanical attachment point and signal conduit for electronic components. The circuit board includes at least two modular card connector assemblies disposed on opposing surfaces of a mounting region of the circuit board. Pin sets of the modular card connector assemblies are connected together via corresponding through holes extending between the opposing surfaces in the mounting region. Further, pins of one or both the modular card connector assemblies may be connected to other electronic components disposed at the circuit board via lateral traces. One or both of the modular card connector assemblies can comprise a modular card socket to removably couple with a modular card. Alternatively, one or both of the modular card connector assemblies comprises a pin interface assembly that is integral to or otherwise fixedly attached to the modular card.

22 Claims, 7 Drawing Sheets

DOUBLE-SIDED CIRCUIT BOARD WITH OPPOSING MODULAR CARD CONNECTOR ASSEMBLIES

BACKGROUND

1. Field of the Disclosure

The present disclosure generally relates to modular processing systems and more particularly relates to mounting and connecting modular cards using a circuit board.

2. Description of the Related Art

Circuit boards, such as motherboards and other printed circuit boards (PCBs), frequently are used to connect various electronic components of a system, both mechanically via sockets or solder joint connections and electrically via the various conductive traces of the circuit board. This arrangement is particularly common in computing systems, in which one or more processors, memory modules, and various peripheral components, such as input/output devices and power-conditioning components, are laterally disposed at the same surface of a motherboard and interconnected via lateral PCB traces at one or more metal layers of the motherboard. This arrangement often requires a relatively-large floorplan area for the motherboard and a relatively high number of metal layers in the motherboard, and can introduce latency, inter-signal skew, and other timing issues due to the relatively long and unmatched lengths of the lateral traces interconnecting the components disposed on the surface of the motherboard.

BRIEF DESCRIPTION OF THE DRAWINGS

The present disclosure may be better understood, and its numerous features and advantages made apparent to those skilled in the art by referencing the accompanying drawings. The use of the same reference numbers in different drawings indicates similar or identical items.

DETAILED DESCRIPTION

Figure 1:
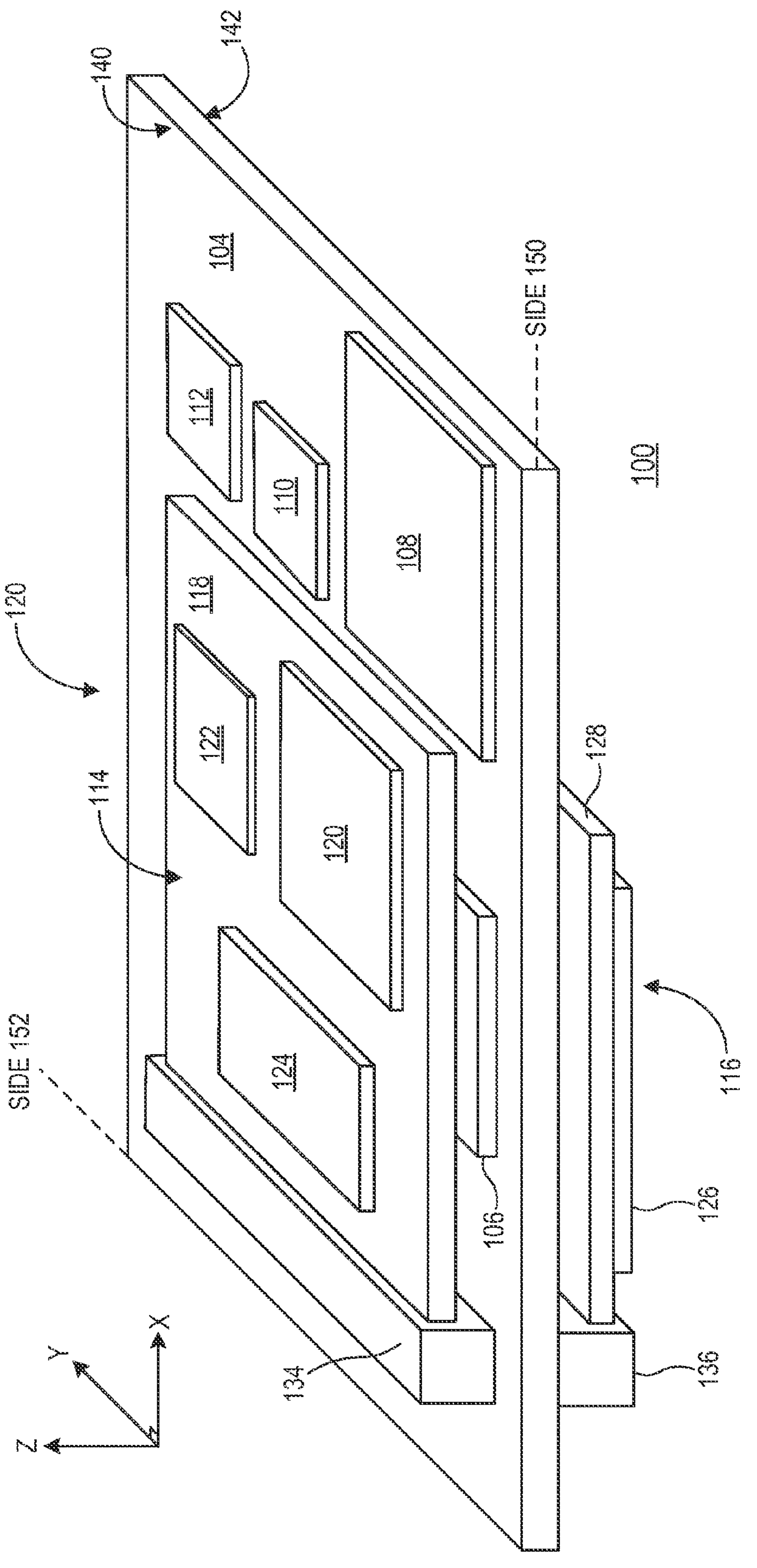
FIG. 1 is a diagram illustrating a perspective view of an electronic assembly with a dual-sided circuit board having opposing modular card connector assemblies in accordance with some embodiments.

FIGS. 1-9 illustrate example embodiments of an electronic assembly that implements a dual-sided circuit board that provides reduced signal latency and reduced floorplan area relative to conventional circuit boards. The electronic assembly includes the dual-sided circuit board, which serves as both a mechanical attachment point and a signal conduit for electronic components of a processing system. The circuit board includes two opposing modular card connector assemblies disposed on opposing surfaces of a mounting region of the circuit board, and whereby pins of one of the modular card connector assemblies are connected to corresponding pins of the other modular card connector assembly via corresponding through holes extending between the opposing surfaces. Further, pins of one or both the modular card connector assemblies may be connected to other integrated circuit devices or other system components disposed at the circuit board via lateral traces of the circuit board. In some embodiments, one or both of the modular card connector assemblies comprises a modular card socket configured to removably mechanically and electrically couple with a corresponding modular card. In other embodiments, one or both of the modular card connector assemblies comprises a pin interface assembly that is integral to or otherwise fixedly attached to a corresponding modular card.

One or both of the modular card connector assemblies may be removably coupled to the circuit board through a press-fit relationship whereby press-fit pins of the modular card connector assemblies are inserted into the through holes to provide the electrical coupling between the modular card connector assemblies, as well as to facilitate mechanical coupling with the circuit board. A retention element, such as a pin, clamp, screw, or lever, may be used to augment the mechanical attachment between the modular card connector assemblies and the circuit board. In other embodiments, one or both of the modular card connector assemblies may be fixedly coupled to the circuit board through a surface mount technology, such as through solder ball reflow between pads of the modular card connector assembly and corresponding pads of the circuit board. The pads may be through-hole pads (that is, pads co-axial with the through-hole openings), offset pads escaped from the through holes via short escape traces, and the like.

The opposing positions of the modular card connector assemblies on opposite surfaces of the circuit board result in connections between pins of the modular card connector assemblies being primarily defined by the relatively short longitudinal distance between the two opposing surfaces (that is, the "thickness") of the circuit board. This is in contrast with conventional approaches whereby the connections between different components on a board are established via relatively long circuit board traces that extend laterally along a length or width of the circuit board. As such, the opposing positions of the modular card connector assemblies enables shorter signaling paths between the modular cards compared to conventional circuit board approaches. Accordingly, timing constraints for signals between components may be relaxed relative to conventional circuit board implementations. Moreover, because the opposing positions of the modular card connector assemblies enables the use of through holes for longitudinal conductivity paths in the circuit board, fewer lateral metal traces are needed to establish conductivity paths between components, thereby enabling the circuit board to have one or both of a smaller floorplan or fewer metal layers while providing the same connectivity compared to conventional circuit boards that rely on lateral trace connections between the components.

FIG. 1 illustrates a perspective view of a processing system 100 implementing a modular card electronic assembly 102, in accordance with some embodiments. The modular card electronic assembly 102 includes a circuit board 104, which comprises, for example, a printed circuit board (PCB), and may be implemented as a motherboard or backplane. The circuit board 104 functions as both the mechanical attachment point for system components and as the means by which power, clocks, and other signals are routed among the system components.

These system components can include individual integrated circuit (IC) devices, individual discrete circuit devices (such as resistors, capacitors, and inductors) and other individually electronic devices disposed at a surface of the circuit board 104, either directly using wire leads or surface mount technology (SMT) leads, or indirectly using a package socket, such as a land grid array (LGA) socket to receive a LGA-based IC package. A network interface controller (NIC) 106, an input/output (I/O) controller 108, a voltage regulator 110, and a read-only memory (ROM) 112 as depicted in FIG. 1 are examples of such individually-mounted system components.

To facilitate the swapping out of groups of system components for purposes of repair, upgrading, and the like, certain system components may be aggregated onto modular cards, such as modular cards 114 and 116, which in turn are mechanically and electrically coupled to the circuit board 104. These modular cards (also referred to as a "add-in boards", "expansion cards", "blades", and "daughterboards") include a printed circuit board, or "card", upon which one or more IC devices, discrete circuit devices, and the like, are disposed. The card includes metal interconnects in the form of vias and traces to provide connectivity among the components of the modular card, as well as to provide connectivity with the pins of the card which interface with corresponding pins of the circuit board 104. Examples of such modular cards include graphics cards to handle graphics processing tasks, memory modules to provide system memory, network interface cards to provide network connectivity, disk drive controller cards to control hard disk drives or optical drives, and processor cards (e.g., server blades) to handle software execution tasks.

The modular cards 114 and 116 are mechanically and electrically coupled to the circuit board 104 via modular card connector assemblies 134 and 136, respectively. As illustrated in greater detail below with reference to FIGS. 6 and 8, in some embodiments one or both of the modular card connector assemblies 134 and 136 are implemented as modular card sockets configured to removably attach to a card edge of the corresponding modular card, and whereby conductive paths are established between sets of card edge contacts of the modular card and corresponding sets of contact pins of the modular card socket. The modular card socket may be configured so as to removably attach to the circuit board 104 via press-fit pins or other retention elements. As illustrated in greater detail below with reference to FIG. 7, one or both of the modular card connector assemblies 134 and 136 may be pin interface assemblies that are integrated with, or otherwise fixedly attached to, the corresponding modular card. In such instances, the modular card may be removably attached to the circuit board 104 via press-fit pins or other retention elements of the corresponding modular card connector or the modular card may be fixedly attached to the circuit board 104 via solder joints, adhesive, thermo bonding, or other relatively permanent affixing mechanisms.

In the example of FIG. 1, the modular card 114 comprises a processing card having one or more software-execution related components disposed at one or both mounting surfaces of a PCB 118. Examples of such components can include one or more processors 120, one or more power regulators 122, and a memory controller 124 or other I/O controller. The modular card 116 includes a memory card, or memory module, having one or more memory ICs 126 disposed at one or both mounting surfaces of a PCB 128. The memory ICs 126 can implement any of a variety of memory architectures, including, but not limited to, volatile memory architectures such as dynamic random access memory (DRAM), synchronous DRAM (SDRAM), and static random access memory (SRAM), or non-volatile memory architectures, such as read-only memory (ROM), flash memory, ferroelectric RAM (F-RAM), magnetoresistive RAM (MRAM), and the like. To illustrate, the modular card 116 can be implemented using a dual in-line memory module (DIMM) architecture, such as a single outline DIMM (SODIMM) architecture or microDIMM architecture.

In a conventional approach, the modular cards 114 and 116 would be disposed on the same mounting surface of a circuit board and connections between the modular cards would be established using traces extending laterally (that is, in parallel with the mounting surfaces of the circuit board) between the two modular cards. However, this approach requires excessive floorplan area for the circuit board in order to accommodate the routing of the lateral traces as well as the mounting area needed for the connector assemblies of the modular cards. Moreover, the lateral traces are relatively long and may be of uneven length due to complex trace routing issues, and thus can introduce undesirable latency and inter-signal skew differentials. Accordingly, to reduce or eliminate these issues, the modular card connector assemblies 134 and 136, and thus the modular cards 114 and 116, are disposed on opposing mounting surfaces of the circuit board 104 with the modular card connector assemblies 134 and 136 having opposing positions (that is, at least partially coextensive along a plane perpendicular to the opposing mounting surfaces) such that connections between pins of the modular card connector assemblies 134 and 136 can be formed using through holes extending between the opposing mounting surfaces. In the example of FIG. 1, the modular card connector assembly 134 and modular card 114 are disposed at a top mounting surface 140 and the modular card connector assembly 136 and modular card 116 are disposed at a bottom mounting surface 142 ("top" and "bottom" being relative to the orientation depicted in FIG. 1). The modular card connector assemblies 134 and 136 are disposed at opposite surfaces of the same mounting region of the circuit board 104 so as to be in opposing positions relative to each other.

This opposing mounting of the modular card connector assemblies 134 and 136 and the use of through holes in the circuit board to establish the intended conductive paths between the modular card connector assemblies 134 and 136 results in shorter conductive paths between the modular cards 114 and 116 compared to conventional approaches as the conductive paths between the modular card connector assemblies 134 and 136 need only traverse the circuit board 104 longitudinally rather than laterally along the circuit board 104. Moreover, because the conductive paths between the modular card connector assemblies 134 and 136 are relatively equal in length, there typically is less inter-signal skew between the modular connector assemblies 134 and 136 compared to lateral PCB trace implementations, thereby reducing the need to employ the various deskew techniques often used to attempt to equalize the lengths of the multiple lines of a bus implemented using lateral traces. For example, conventional approaches use extensive serpintining of PCB traces in an attempt to equalize the frequently disparate lengths of the traces used to implement a bus in the circuit board. Due to the relatively shorter and more equal conductive path lengths afforded by the coaxial positioning of the modular card connector assemblies 134 and 136, less equalization is needed, thereby allowing either serpentine traces to be implemented on the modular card rather than the circuit board 104, or allowing serpintining of traces to be omitted altogether, thereby relaxing the constraints on the trace routing for the circuit board 104.

Figure 2:
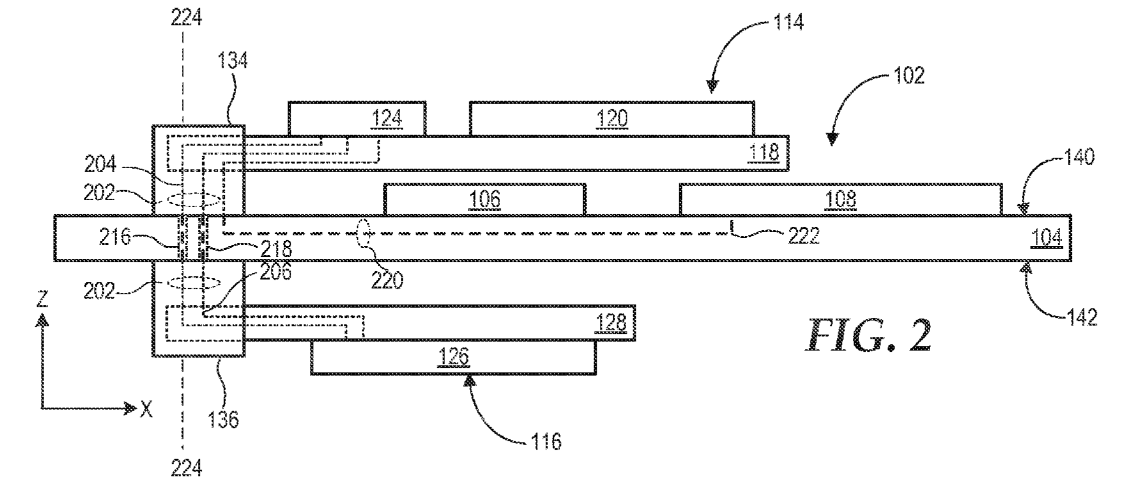
FIG. 2 is a diagram illustrating a side view of the electronic assembly of FIG. 1 in accordance with some embodiments.

FIG. 2 illustrates a side view of the electronic assembly 102 from side 150 (FIG. 1) in accordance with some embodiments. As shown, the modular card 114 is connected to the top mounting surface 140 of the circuit board 104 via the modular card connector assembly 134 and the modular card 116 is connected to the bottom surface 142 of the circuit board 104 via the modular card connector assembly 136, and wherein the modular card connector assemblies 134 and 136 are coplanar and coextensive, that is, disposed at opposite sides of the same mounting region of the circuit board 104.

The one or more processors 120 of the modular card 114 operate to execute software e.g., executable instructions) using data and instructions stored in the one or more memory ICs 126 of the modular card 116. To enable the transfer of data and instructions between the one or more processors 120 and the memory ICs 126, the memory controller 124 of the modular card 114 conducts signaling with the modular card 116 via a memory bus 202 implemented using conductive paths (e.g., conductive paths 204 and 206) that incorporate corresponding sets of pins of the modular card 114, the modular card connector assembly 134, the modular card connector assembly 136, and the modular card 116. The conductive paths of the memory bus 202 traverse the circuit board 104 longitudinally using through holes, such as through holes 216 and 218, that extend from the top mounting surface 140 to the bottom mounting surface 142. The memory bus 202 can conduct the various signaling typically found in memory bus architectures or memory interface architectures, including data signaling, address signaling, timing signaling, control signaling, and the like. Other busses or inter-card interconnects can be implemented in a similar manner.

One or both of the modular cards 114 and 116 also may conduct signaling with individual system components disposed at the circuit board 104 or with other modular cards (not shown) disposed at the circuit board 104. To illustrate, signaling between the I/O controller 108 and the memory controller 124 may be conducted via a peripheral bus 220 implemented as a set of conductive paths (e.g., conductive path 222) formed between the memory controller 124 and the I/O controller 108 using a set of one or more pins of the modular card 114, a corresponding set of one or more pins of the modular card connector assembly 134, corresponding set of one or more lateral traces of the circuit board 104, and a corresponding set of one or more pins of the I/O controller 108. The lateral traces of the circuit board 104 may be implemented at one or more metal layers of the circuit board 104, and traces below the surface layer of the circuit board 104 can include vias or through holes to facilitate connection between the corresponding pins of the modular card connector assembly 134 and the traces of the circuit board.

Figure 3:
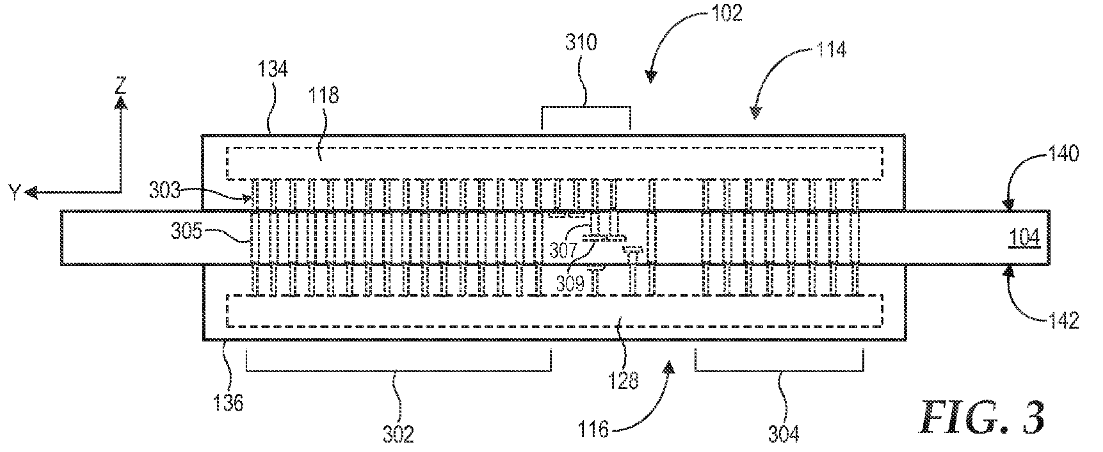
FIG. 3 is a diagram illustrating a rear view of the electronic assembly of FIG. 1 in accordance with some embodiments.

FIG. 3 illustrates a side view of the electronic assembly 102 from side 152 (FIG. 1) in accordance with some embodiments. FIG. 3 also illustrates an example pinout configuration of the modular card connector assemblies 134 and 136 for a pin row that lies along a plane 224 (FIG. 2) is also illustrated relative to the illustrated side view. In the depicted example, the memory bus 202 between the modular card connector assembly 134 and the modular card connector assembly 136 is implemented as a data/address sub-bus 302 and a control sub-bus 304. The data/address sub-bus 302 includes sixteen bus lines 303, or conductive paths, in the illustrated pin row, whereby the bus lines are implemented in part using a set of through hole vias 305 extending between the mounting surfaces 140 and 142 of the circuit board 104 and corresponding sets of pins of the modular card connector assemblies 134 and 136. The control sub-bus 304 includes eight bus lines 303 in the illustrated pin row, which are likewise implemented using a sets of though holes 305 of the circuit board 104 and corresponding sets of pins of the modular card connector assemblies 134 and 136. The peripheral bus 220 includes four bus lines in the illustrated pin row, whereby these bus lines are implemented in part using a set of lateral traces 307 and, if the traces are not surface traces, vias 309. The electronic assembly 102 may be likewise configured for buses or other interconnects to facilitate signaling between the modular card connector assembly 136 and other system components disposed at the circuit board 104.

Figure 4:
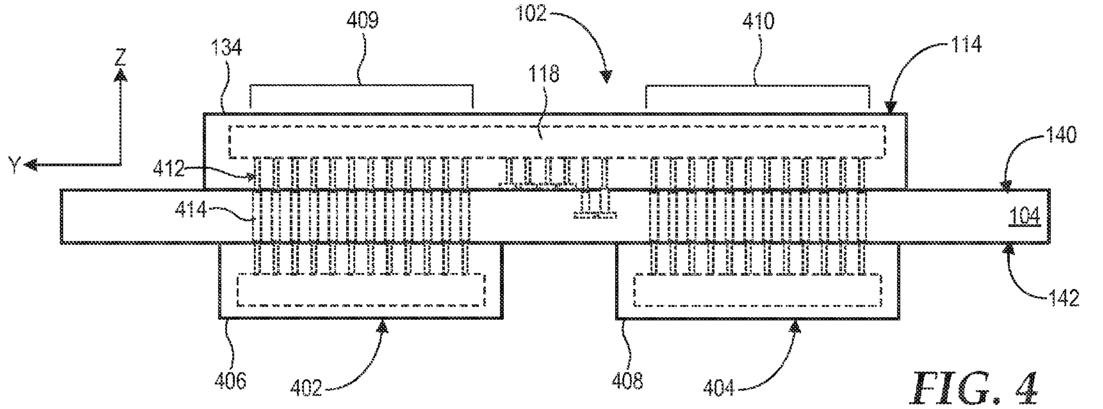
FIG. 4 is a diagram illustrating a rear view of an alternative implementation of the electronic assembly of FIG. 1 in accordance with some embodiments.

Although example embodiments having two modular card connector assemblies (and thus two modular cards) on opposing sides of a mounting region of the circuit board 104 are primarily described herein for ease of illustration, in other embodiments, more than two modular card connector assemblies may be disposed on opposing sides of a mounting region of the circuit board 104. FIG. 4 illustrates a side view from side 152 (FIG. 2) of an alternative example of the electronic assembly 102 that employs more than two coplanar modular card connector assemblies. In the depicted example, the modular card 114 is longitudinally connected (relative to the circuit board 104) to two modular cards 402 and 404 via modular card connector assemblies 406 and 408, which are disposed at the bottom mounting surface 142 opposite to the modular card connector assembly 134 disposed in the same mounting region at the top mounting surface 140. In this example, the modular cards 402 and 404 each could comprise a memory module card separately controlled by the memory controller 124 via a corresponding one of memory busses 409 and 410 implemented using conductive paths 412 implemented in part by sets of through holes 414 disposed between the modular card connector assemblies 406 and 408 and the modular card connector assembly 134.

Figure 5:
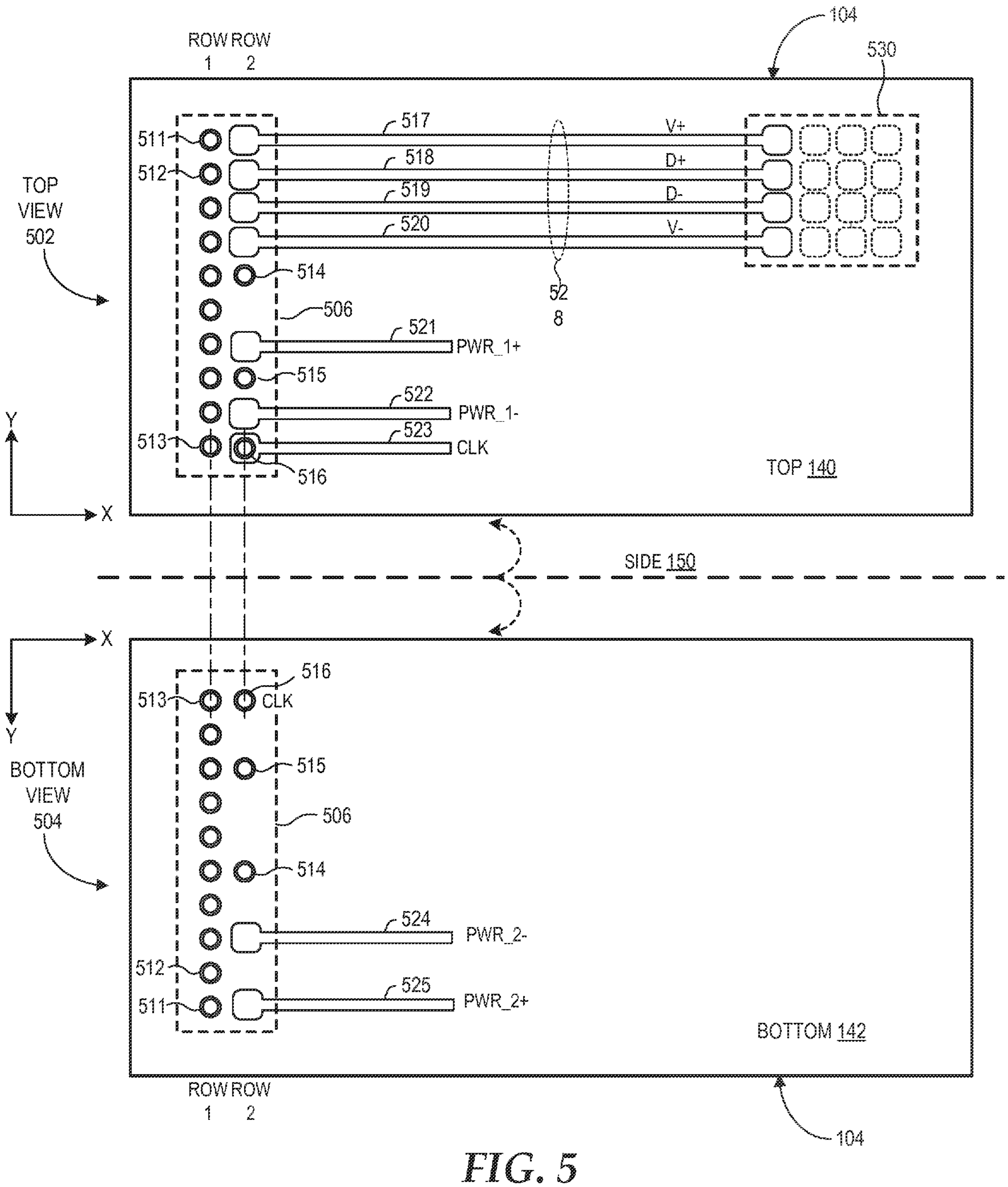
FIG. 5 is a diagram illustrating both a top plan view and a bottom plan view of a circuit board configured to connect opposing modular card connector assemblies in accordance with some embodiments.

FIG. 5 illustrates plan views 502 and 504 of the top mounting surface 140 and bottom mounting surface 142, respectively, of an example implementation of the circuit board 104 of the electronic assembly 102 in accordance with some embodiments. The plan views 502 and 504 are oriented in FIG. 5 relative to the side 150 (FIG. 1). In the depicted example, the circuit board 104 includes a mounting region 506 defined by coextensive, opposing regions of the mounting surfaces 140 and 142 of the circuit board 104. Formed within the mounting region 506 are various metal interconnect structures to facilitate electrical connections between the pins of the modular card connector assembly 134 (FIG. 1) to be mounted within the mounting region 506 at the top mounting surface 140 and to facilitate electrical connections between the pins of the modular card connector assembly 136 (FIG. 1) to be mounted within the mounting region 506 at the bottom mounting surface 142. These metal interconnect structures include through holes to facilitate longitudinal electrical connections between the pin sets of the modular card connector assembly 134 and the corresponding pin sets of the modular card connector assembly 136. These metal interconnect structures also can include lateral traces, blind vias, back-drilled through holes, or plated through holes to facilitate lateral electrical connections between pin sets of the modular card connector assemblies and pin sets of other components disposed at the mounting surfaces of the circuit board 104.

In the depicted example, the pinout configuration of the mounting region 506 employs two rows of contacts. One row, identified as "Row 1" is composed entirely of through holes, such as through holes 511, 512, and 513, to provide electrical contact between corresponding pins of the modular card connector assemblies 134 and 136. The other row, identified as "Row 2", is implemented as a combination of through holes, such as through holes 514, 515, and 516, and lateral interconnect structures, such as lateral traces 517, 518, 519, 520, 521, 522, 523, 524, and 525. While the lateral traces 517-525 are shown as surface traces in FIG. 5 for ease of illustration, some or all of the lateral traces 517-525 may be implemented as buried traces at one or more sub-surface metal layers of the circuit board 104. Moreover, although not illustrated in FIG. 5, through holes, press-fit holes, coaxial blind vias, back-drilled plated through holes, or solder pads may be implemented in those pin out locations that are not used to conduct signaling so as to provide additional points of attachment for the corresponding modular card connector assembly.

The through holes of Row 1 and certain through holes of Row 2, such as through holes 514 and 515, may together implement the portion of the memory bus 202 (FIG. 2) disposed between the corresponding pin set of the modular card connector assembly 134 and the corresponding pin set of the modular card connector assembly 136. The lateral traces 517-525 facilitate electrical contact between pins of the modular card connector assemblies 134 and 136 and various components disposed at the circuit board 104. For example, the trace set of lateral traces 517-520 implements the power lines and data lines of a Universal Serial Bus 528 to connect pins of the modular card connector assembly 134 to the corresponding pin set of an IC device 530 surface mounted to the top mounting surface 140 of the circuit board 104. As another example, the lateral traces 521 and 522 are used as a trace set to distribute power from one power domain (denoted "PWR_1") to the modular card connector assembly 134 and the later traces 524 and 525 are used as a trace set to distribute power from another power domain (denoted "PWR_2") to the modular card connector assembly 136. In some instances, certain signaling may be conducted between another system component and both of the modular card connector assemblies 134 and 136 using a combination of a through hole and a lateral trace. For example, a clock source (not shown) disposed at the top mounting surface 140 can distribute a clock signal (denoted "CLK") to both a pin of the modular card connector 134 and a pin of a modular card connector 136 via the through hole 516 and the lateral trace 523, which is electrically coupled to the through hole 516 through, for example, a capture pad formed at the through hole 516.

In some embodiments, the electronic assembly 102 can take advantage of unnecessary or unused signal capabilities provided by standard sockets to enable both longitudinal signaling between the modular cards 114 and 116 and lateral signaling between one or both of the modular cards 114 and 116 and other system components on the circuit board 104. In such instances, the socket pins that otherwise would be used to conduct unnecessary or unused signaling can instead be repurposed to facilitate signaling with system components laterally disposed relative to the socket. To illustrate, the electronic assembly 102 may implement a standard 200-pin SODIMM DRAM socket as the modular card connector assembly 134 to as to couple with a 200-pin SODIMM DRAM memory module (one example of the modular card 116). The standard pin assignment for the 200-pin SODIMM DRAM architecture assigns pins 10, 26, 52, 67, 130, 147, 170, and 185 for use in specifying an 8-bit input data mask for write data. If this data mask capability is not implemented or otherwise not necessary in an implementation of the processing system 100 using 200-pin SODIMM DRAM, then four of the eight pins that otherwise would be used to implement this data mask in the memory bus signaling instead can be repurposed to provide connectivity between the modular card 114 and the traces 517-520 implementing the USB 528. As such, this standard socket can be used as both the conduit for longitudinal signaling with the opposite modular card, as well as for lateral signaling with laterally positioned system components.

Figure 6:
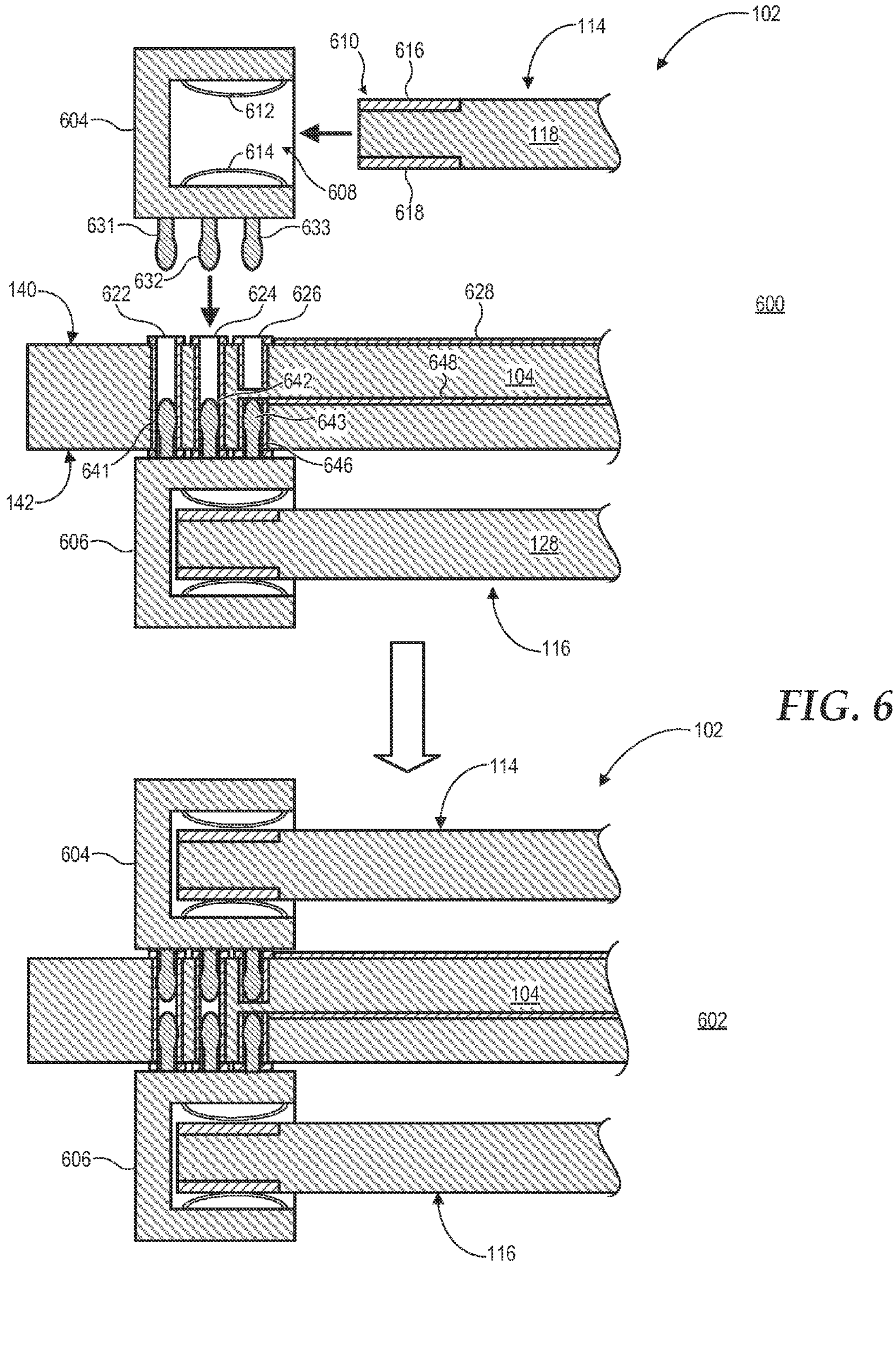
FIG. 6 is a cross-section view of an electronic assembly employing opposing press-fit modular card sockets in accordance with some embodiments.
Figure 7:
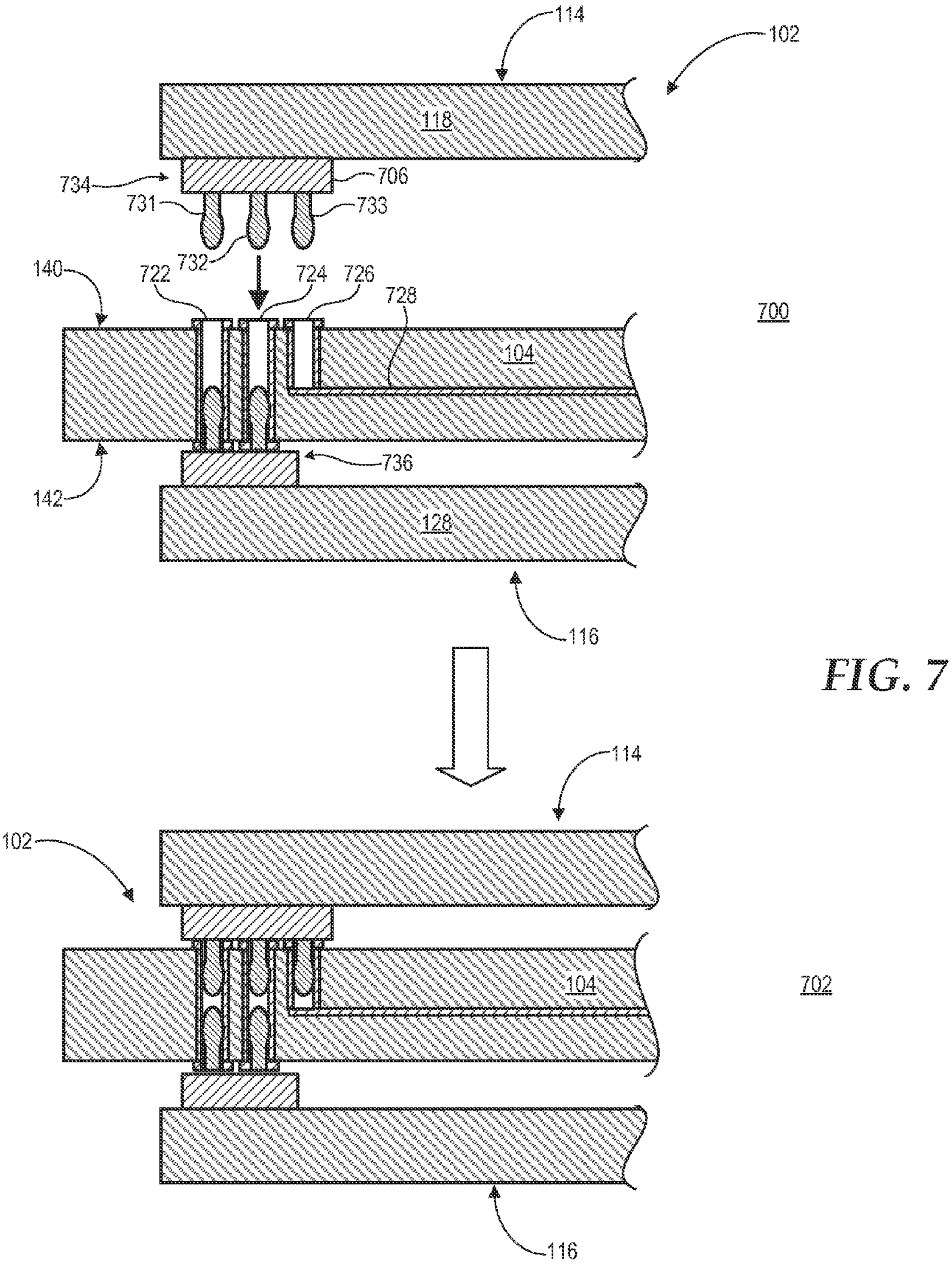
FIG. 7 is a cross-section view of an electronic assembly employing press-fit integrated modular card connections in accordance with some embodiments.
Figure 8:
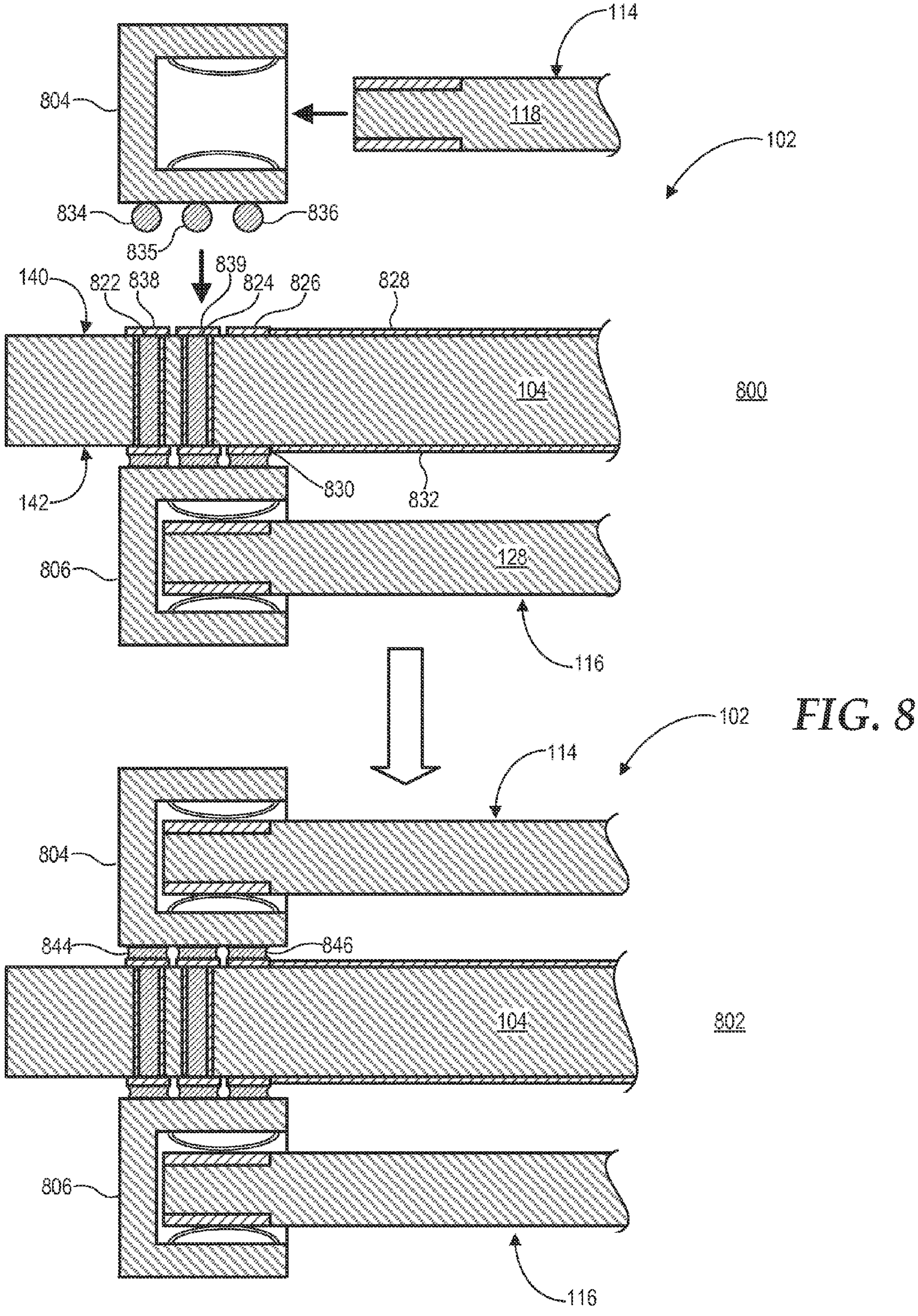
FIG. 8 is a cross-section view of an electronic assembly employing opposing surface-mount modular card sockets in accordance with some embodiments.

FIGS. 6-8 illustrate alternative cross-section views of a portion of the electronic assembly 102 along a plane parallel with side 150 (FIG. 1) in accordance with various embodiments. Referring initially to FIG. 6, cross-section views 600 and 602 of the electronic assembly 102 depict an example implementation whereby the modular card connector assemblies 134 and 136 are implemented as card sockets 604 and 606, respectively, which have a press-fit relationship with the circuit board 104. The card sockets 604 and 606 can comprise any of a variety of standardized or proprietary socket types, and may comprise the same or different socket types. To illustrate, the card socket 604 and the card socket 606 each implement a particular SODIMM socket, which would enable straightforward configuration of the pinouts between sets of pins of the card sockets 604 and 606. As another example, the card socket 604 can comprise a Peripheral Component Interconnect-Express (PCI-E) socket and the card socket 606 can comprises a microDIMM socket.

The card sockets 604 and 606 each have a socket opening 608 to receive a card edge 610 of the corresponding one of PCBs 118 and 128. The socket opening 608 comprises a plurality of contacts, such as contacts 612 and 614, to physically contact corresponding card edge contacts, such as card edge contracts 616 and 618, at the card edge 610, thereby providing electrical connections between the card socket and the corresponding modular card. Note that although FIG. 6 illustrates the sockets in a right-angle configuration so as to orient the corresponding received PCB parallel to the circuit board 104, the sockets may orient the corresponding PCB at any angle, such as an orientation that is perpendicular to the mounting surface of the circuit board 104 or orientation that is 45 degrees relative to the mounting circuit board 104. In some embodiments, the modular card and the corresponding card socket are configured to provide a "press-fit" relationship that forms a friction coupling that helps maintain the connector assemblies in position under expected operational conditions. This press-fit relation thereby allows the modular card to be removably attachable to the card socket, and thus permits swapping between different modular cards. This press-fit relationship can be implemented through friction or pressure placed on the card edge contacts by the corresponding contacts of the socket opening 608 and through friction or pressure placed on the card edge 610 by one or more walls of the socket opening 608. A retention element, such as a pin, clamp, screw, or lever, also may be used to augment the mechanical attachment.

The card sockets 604 and 606, in turn, have a press-fit relationship with the circuit board 104 so as to allow the card sockets 604 and 606 to be removably attachable to the circuit board 104. In some embodiments, this press-fit relationship is implemented through the use of sets of press-fit pins on the board-facing side of the card socket, which are inserted into corresponding through holes in the mounting region of the circuit board so as to provide both mechanical coupling through the friction between the press-fit pins and the walls of the through holes and electrical coupling through the metal material of the press-fit pins and the metal-plated walls of the through holes. In the illustrated example, the card socket 604 implements three rows of press-fit pins, including press-fit pins 631, 632, and 633, and the card socket 606 implements three rows of press-fit pins, including press-fit pins 641, 642, and 643. The press-fit pins of the card socket 604 are electrically connected to corresponding contacts of the socket opening 608 of the card socket 604 and the press-fit pins of the card socket 606 are electrically connected into the corresponding contacts of the socket opening 608 of the card socket 606.

Cross-section views 600 and 602 illustrate an example whereby the circuit board 104 implements two rows of through holes, including through holes 622 and 624, to provide longitudinal signaling between the card sockets 604 and 606. The through holes may be formed by, for example, drilling corresponding holes through the circuit board 104 and then plating the walls and a portion of the surfaces surrounding the hole openings with metal or other conductive material so as to form a plated through hole (PTH) that provides a continuously conductive structure that extends from the top mounting surface 140 to the bottom mounting surface 142.

The circuit board 104 further implements a third row of pin outs in the mounting region at the top mounting surface 140 and the bottom mounting surface 142 comprising coaxial holes that serve as mechanical attachment points for corresponding press-fit pins and may facilitate lateral signaling with other components on the circuit board 104 for the card socket 604 and the card socket 606, respectively. These coaxial holes can include coaxial blind vias comprising plated barrels on both sides of the circuit board 104 but without a through hole connecting them. A pair of coaxial holes also may be implemented as a back-drilled plated through hole in which a through hole with a plated barrel is formed and then a secondary process is performed to partially remove the plated barrel on one side of the through hole so that a pin inserted on that side is not brought into electrical contact with the plating of the remainder of the through hole. The depicted example illustrates an implementation of these coaxial holes as coaxial blind vias 626 and 646. The blind via 626 at the top surface 140 is coupled to a surface trace 628 and functions as a press-fit hole so as to receive a corresponding press-fit pin 633 of the card socket 604. Likewise, the blind via 646 at the bottom surface 142 is coupled to a buried trace 648 and functions as a press-fit hole on as to receive a corresponding press-fit pin 643 of the card socket 606. One or both of the conductive structure formed by the blind via 626 and the trace 628 and the conductive structure formed by the blind via 646 and the trace 648 may be used for conducting lateral signaling between the corresponding card socket and other components on the circuit board 104. In instances whereby the corresponding socket pin is inactive, the through hole or blind via may be grounded (or pulled up to a voltage). To illustrate, the processing modular card 114 may use the press-fit pin 633 to conduct lateral signaling, whereas the coaxial press-fit pin 643 may be intended to be inactive and thus the blind via 646 may be coupled to a ground potential via the buried trace 648.

Accordingly, as illustrated by cross-section view 602, after the card sockets 604 and 606 are attached to the corresponding mounting surfaces of the circuit board 104 and the module cards 114 and 116 are attached to the corresponding card sockets 604 and 606, respectively, longitudinal conductive paths are created between the modular cards 114 and 116 via the card sockets 604 and 606 and the through holes formed therebetween. Moreover, a lateral conductive path is created between the modular card 114 and another component on the circuit board 104 via the card socket 604, the press-fit pin 633, the blind via 626, and the surface trace 628.

FIG. 7 illustrates cross-section views 700 and 702 of the electronic assembly 102 for an example implementation whereby the modular card connector assemblies 134 and 136 are implemented as pin interface assemblies 734 and 736 that are integral, or fixedly attached, components of the modular cards 114 and 116, respectively, and which have a press-lit relationship with the circuit board 104. In the example of FIG. 7, the circuit board 104 is configured in a similar manner as described above with reference to FIG. 6, whereby the circuit board 104 includes two rows of through holes, such as through holes 722 and 724, to provide longitudinal signaling between the modular cards 114 and 116, and a third row to provide pin outs in support of lateral signaling with other system components. In this example, the third row includes a blind via 726 providing access to a buried trace 728, which in turn may be connected to a pin of anther system component or connected to a voltage or ground terminal of a power source.

As illustrated by cross-section view 700, the pin interface assembly 734 implements, in this example, a connector base 706 having one or more rows of press-fit pins, such as press-fit pins 731, 732, and 733, which are connected to the metal interconnect structures (not shown) of the modular card 114. The connector base 706 is illustrated as affixed to an edge of the modular card 114, but in other embodiments the connector base 706 may be affixed to other locations of the modular card 114. The connector base 706 may be fixedly attached to, or integrated with, the PCB 118 of the modular card 114 using, for example, an adhesive, thermo bonding, and the like. In other embodiments, the press-fit pins of the modular card connector assembly 134 are attached directly to the PCB 118. The pin interface assembly 736 may be configured with respect to the modular card 116.

As illustrated by cross-section view 702, after the modular cards 114 and 116 have been attached to the circuit board 104 via the press-fit pins, longitudinal conductive paths are formed between the circuitry of the modular card 114 and the modular card 116 via the through holes of the circuit board and corresponding pin sets of press-fit pins of the modular cards 114 and 116. Moreover, a lateral conductive path is formed between the circuitry of the modular card 114 and another component on the circuit board 104 using the blind via 726 and the buried trace 728.

FIG. 8 illustrates cross-section views 800 and 802 of the electronic assembly 102 for an example implementation whereby the modular card connector assemblies 134 and 136 are implemented as card sockets 804 and 806, respectively, which are fixedly attached to the circuit board 104. The card sockets 804 and 806 are configured in a similar manner as described above with reference to the card sockets 604 and 606. However, rather than using press-fit pins to connect to the corresponding pin out configuration of the circuit board 104, the card sockets 804 and 806 employ a surface mount technology (SMT) to fixedly attach the pins of the card sockets 804 and 806 to the circuit board 104.

For example, cross-section views 800 and 802 illustrate an example whereby the circuit board 104 implements two rows of through holes, including through holes 822 and 824, to provide longitudinal signaling between the card sockets 804 and 806 and a third row of pin outs in the mounting region at both the top mounting surface 140 and the bottom mounting surface 142 to provide lateral signaling with other components on the circuit board for the card sockets 804 and 806. This lateral signaling including, for example, solder pad 826 connected to a surface trace 828 at the top mounting surface 140 and a solder pad 830 connected to a surface trace 832 at the bottom mounting surface 142. Accordingly, the card socket 804 and the card socket 806 each implements three rows of solder pads and bumps, such as solder bumps 834, 835, and 836, to couple each pad of the card socket to the corresponding solder pad of the circuit board 104. As illustrated by cross-section view 800, the circuit board 104 can use capture pads, such as capture pads 838 and 839, located over the through holes as the solder pads used to connect to the corresponding pad of the card socket. In other embodiments, short escape traces can be used to route the solder pads a short distance away from the through holes.

As illustrated by cross-section view 802, after the card sockets 804 and 806 have been surface mounted to the corresponding solder pads of the circuit board 104 and the module cards 114 and 116 are attached to the corresponding card sockets 804 and 806, respectively, longitudinal conductive paths are created between the modular cards 114 and 116 via the card sockets 804 and 806 and solder joints (e.g., solder joint 844) and through holes formed therebetween. Moreover, a lateral conductive path is created between the modular card 114 and another component on the circuit board 104 via the card socket 804, the solder joint 846 resulting from reflow of the solder bump 836, and the surface trace 828. Likewise, a lateral conductive path is created between the modular card 116 and another component on the circuit board via the card socket 806 and a solder joint connecting the solder pad 830 and the surface trace 832 to the corresponding pin of the card socket 806.

Although FIGS. 6-8 illustrate various embodiments whereby the modular card connector assemblies 134 and 136 are of the same type of assembly, in other embodiments, they may be of different types of assembly. To illustrate, the modular card connector assembly 134 may be implemented as the fixedly attached card socket 804 of FIG. 8 while the modular card connector assembly 136 is implemented as the press-fit-type card socket 604 of FIG. 6.

Figure 9:
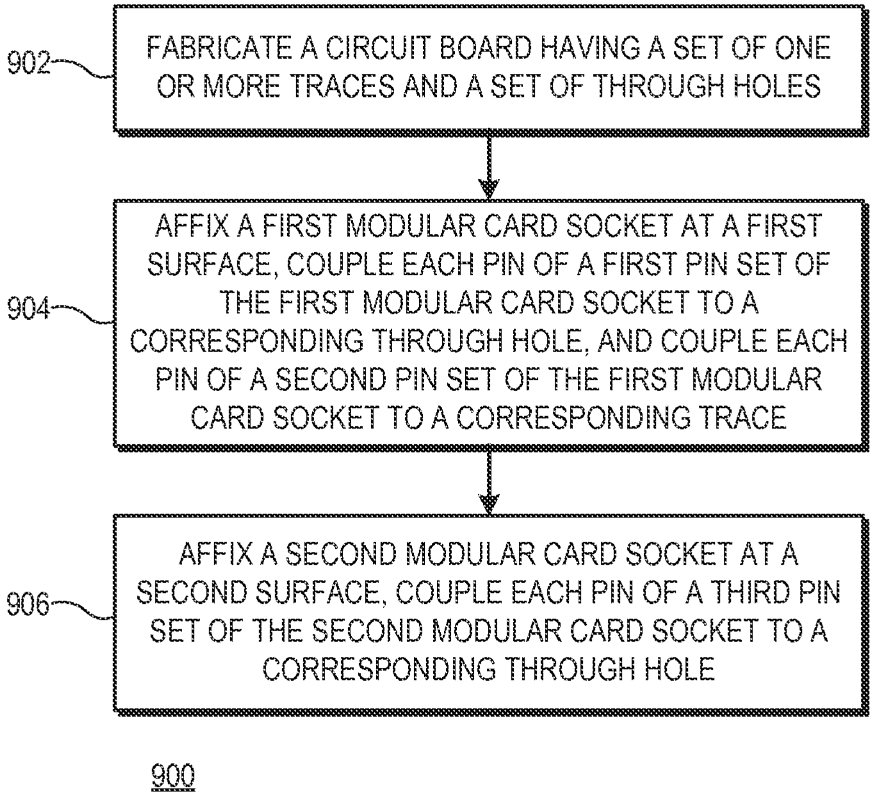
FIG. 9 is a flow diagram illustrating an example method for fabricating the electronic assembly of FIG. 1 in accordance with some embodiments.

FIG. 9 illustrates an example method 900 for fabricating the electronic assembly 102 in accordance with some embodiments. The method 900 includes fabricating a circuit board comprising a set of one or more traces and a set of through holes extending between a first surface of the circuit board and an opposing second surface of the circuit board at block 902. At block 904, the method 900 includes affixing a first modular card socket at the first surface of the circuit board, coupling each pin of a first pin set of one or more pins of the first modular card socket to a corresponding through hole of the set of through holes, and coupling each pin of a second pin set of one or more pins of the first modular card socket to a corresponding trace of the set of one or more traces. At block 906, the method 900 additionally includes affixing a second modular card socket at the second surface of the circuit board and coupling each pin of a second pin set of one more pins of the second modular card socket to a corresponding through hole of the set of through holes. As noted above, each pin of the first pin set can comprise a press-fit pin, such that coupling each pin of the first pin set to a corresponding through hole comprises inserting a press-fit pin into the corresponding through hole. In other embodiments, coupling each pin of the first pin set to a corresponding through hole comprises coupling the pin to the corresponding through hole via a solder joint.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to e regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any features that may cause any benefit, advantage, or solution to occur or become more pronounced are not to be construed as a critical, required, or essential feature of any or all the claims.

What is claimed is:

1. An electronic assembly comprising:

a circuit board comprising:

a set of through holes extending between a first surface of the circuit board and an opposing second surface of the circuit board;

a first modular card socket disposed at the first surface of the circuit board, the first modular card socket having a first pin set of one or more pins, each pin of the first pin set coupled to a corresponding through hole of the set of through holes; and a second modular card socket disposed opposite the first modular card socket at the second surface of the circuit board, the second modular card socket having a second pin set of one more pins, each pin of the second pin set coupled to a corresponding through hole of the set of through holes.

2. The electronic assembly of claim 1, wherein each pin of the first pin set comprises a press-fit pin inserted in the corresponding through hole.

3. The electronic assembly of claim 1, wherein each pin of the first pin set comprises a solder joint coupled to a corresponding pad coupled to the corresponding through hole.

4. The electronic assembly of claim 1, further comprising:

a first modular card inserted into the first modular card socket; and a second modular card inserted into the second modular card socket.

5. The electronic assembly of claim 4, wherein:

the first modular card comprises a processing card having at least one processor; and the second modular card comprises a memory module card having at least one memory integrated circuit; and the first modular card and the second modular card conduct memory bus signaling using the first pin set, the set of through holes, and the second pin set.

6. The electronic assembly of claim 4, further comprising:

an integrated circuit device disposed at the first surface of the circuit board and having a third pin set of one or more pins, each pin of the third pin set coupled to a corresponding trace of a set of one or more traces of the circuit board;

wherein the first modular card socket further comprises a fourth pin set of one or more pins, each pin of the fourth pin set coupled to a corresponding trace of the set of one or more traces; and wherein the first modular card and the integrated circuit device conduct bus signaling via the third pin set, the set of one or more traces, and the fourth pin set.

7. The electronic assembly of claim 1, wherein the first modular card socket further comprises a third pin set of one or more pins, each pin of the third pin set coupled to a corresponding trace of a set of one or more traces of the circuit board.

8. An electronic assembly comprising:
- a circuit board having a first mounting surface and a second mounting surface opposite the first mounting surface, the circuit board comprising:
  - a set of through holes, each through hole extending between the first mounting surface and the second mounting surface; and
  - a first trace set of one or more traces;
- a first modular card connector assembly disposed at the first mounting surface and comprising a first pin set of one or more pins and a second pin set of one or more pins, each pin of the first pin set comprising a press-fit pin inserted in a corresponding through hole of the set of through holes and each pin of the second pin set coupled to a corresponding trace of the first trace set; and
- a second modular card connector assembly disposed at the second mounting surface opposite of the first modular card connector assembly and comprising a third pin set of one or more pins, each pin of the third pin set comprising a press-fit pin inserted in a corresponding through hole of the plurality of through holes.

9. The electronic assembly of claim 8, wherein the first modular card connector assembly comprises a first modular card socket having a socket opening to removably couple with a card edge of a modular card.

10. The electronic assembly of claim 9, wherein the second modular card connector assembly comprises a second modular card socket having a second opening to removably couple with a modular card.

11. The electronic assembly of claim 10, further comprising:
- a first modular card coupled with the first modular card socket, the first modular card comprising:
  - a fourth pin set of one or more pins, each pin of the fourth pin set comprising a card edge contact electrically coupled to a corresponding pin of the first pin set via the socket opening of the first modular card socket;
  - a fifth pin set of one or more pins, each pin of the fifth set comprising a card edge contact coupled to a corresponding pin of the second pin set via the socket opening of the first modular card socket;
  - one or more processors; and
  - a memory controller coupled to the one or more processors and coupled to the fourth pin set of one or more pins; and
- a second modular card coupled with the second modular card socket, the second modular card comprising:
  - a sixth pin set of one or more pins, each pin of the sixth pin set comprising a card edge contact electrically coupled to a corresponding pin of the third pin set via the socket opening of the second modular card socket; and
  - one or more memory integrated circuits electrically coupled to the sixth pin set of one or more pins.

12. The electronic assembly of claim 11, further comprising:
- an integrated circuit device disposed at the first mounting surface of the circuit board, the integrated circuit device comprising a seventh pin set of one or more pins, each pin of the seventh pin set electrically coupled to a corresponding trace of the first trace set.

13. The electronic assembly of claim 9, wherein:
- the second modular card connector assembly further comprises a fourth pin set of one or more pins; and
- the circuit board further comprises:
  - a second trace set of one or more traces;
  - a first hole disposed at the first mounting surface, the first hole coupling a pin of the second pin set to the corresponding trace of the first trace set; and
  - a second hole disposed at the second mounting surface, the second hole coaxial with the first hole and coupling a pin of the fourth pin set to a trace of the second trace set.

14. The electronic assembly of claim 13, wherein the first hole and second hole comprise one of: coaxial blind vias; and a back-drilled plated through hole.

15. The electronic assembly of claim 8, further comprising:
- a first modular card disposed at the first mounting surface; and
- wherein the first modular card connector assembly comprises a first pin interface assembly fixedly attached to the first modular card; and
- wherein the first pin set comprises one or more press-fit pins of the first pin interface assembly.

16. The electronic assembly of claim 15, wherein:
- the circuit board comprises a set of one or more press-fit holes, each press-fit hole coupled to a corresponding trace of the first trace set; and
- the second pin set comprises one or more press-fit pins of the first pin interface assembly, each press-fit pin inserted in a corresponding press-fit hole of the set of one or more press-fit holes.

17. The electronic assembly of claim 15, further comprising:
- a second modular card disposed at the second mounting surface; and
- wherein the second modular card connector assembly comprises a second pin interface assembly fixedly attached to the second modular card; and
- wherein the third pin set comprises one or more press-fit pins of the second pin interface assembly.

18. The electronic assembly of claim 17, wherein:
- the first modular card comprises a processing modular card having one or more processors and a memory controller; and
- the second modular card comprises a memory module card having one or more memory integrated circuits.

19. The electronic assembly of claim 8, further comprising:
- an integrated circuit device disposed at the first mounting surface, the integrated circuit device comprising a fourth pin set of one or more pins, each pin of the fourth pin set coupled to a corresponding trace of the set of traces.

20. A processing system comprising:
- a circuit board comprising:
  - an integrated circuit device disposed at a first surface of the circuit board;
  - first modular card socket and a second modular card socket disposed at opposing surfaces of a mounting region of the circuit board;
  - a set of one or more traces electrically coupling a first pin set of one or more pins of the first modular card socket to a second pin set of one or more pins of the integrated circuit device; and
  - a set of through holes electrically coupling a third set of pins of the first modular card socket to a fourth set of pins of the second modular card socket;

a processing modular card removably attached to the first modular card socket, the processing modular card comprising:

a first set of card edge contacts, each card edge contact electrically coupled to a corresponding pin of the first pin set;

a second set of card edge contacts, each card edge contact electrically coupled to a corresponding pin of the third pin set;

one or more processors;

a memory controller coupled to the first pin set and the second pin set; and a memory modular card removably attached to the second modular card socket, the memory modular card comprising:

a third set of card edge contacts, each card edge contact coupled to a corresponding pin of the fourth pin set;

one or more memory integrated circuits; and wherein the memory controller and the memory integrated circuits are to conduct memory bus signaling via the first set of through holes; and wherein the memory controller and the integrated circuit device are to conduct bus signaling via the set of traces.

21. A method of fabricating an electronic assembly, the method comprising:

fabricating a circuit board comprising a set of one or more traces and a set of through holes extending between a first surface of the circuit board and an opposing second surface of the circuit board;

affixing a first modular card socket at the first surface of the circuit board, coupling each pin of a first pin set of one or more pins of the first modular card socket to a corresponding through hole of the set of through holes, and coupling each pin of a second pin set of one or more pins of the first modular card socket to a corresponding trace of the set of one or more traces; and affixing a second modular card socket at the second surface of the circuit board and coupling each pin of a second pin set of one more pins of the second modular card socket to a corresponding through hole of the set of through holes.

22. The method of claim 21, wherein:

each pin of the first pin set comprises a press-fit pin; and coupling each pin of the first pin set to a corresponding through hole comprises inserting a press-fit pin into the corresponding through hole.

* * * * *